(12) United States Patent
Cherniski et al.

(10) Patent No.: US 6,404,297 B2
(45) Date of Patent: *Jun. 11, 2002

(54) ELECTROMAGNETIC INTERFERENCE BLOCKING POWER BUS BAR

(75) Inventors: Andrew Michael Cherniski, Rescue; Gerald J. Nelson, Roseville, both of CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/354,014

(22) Filed: Jul. 15, 1999

(51) Int. Cl.[7] ................................................. H03H 7/00
(52) U.S. Cl. ............................ 333/12; 333/182; 361/818
(58) Field of Search ........................ 333/12, 182, 184; 361/818, 734; 174/35 R, 36

(56) References Cited

U.S. PATENT DOCUMENTS

| | | | | |
|---|---|---|---|---|
| 1,994,905 A | * | 3/1935 | Bowles | 174/35 R X |
| 3,634,782 A | * | 1/1972 | Marshall | 174/36 |
| 5,604,668 A | * | 2/1997 | Wohrstein et al. | 174/35 R X |
| 5,770,898 A | * | 6/1998 | Hannigan et al. | 174/35 R X |
| 5,905,641 A | * | 5/1999 | John et al. | 361/818 |
| 6,037,846 A | * | 3/2000 | Oberhammer | 333/12 X |
| 6,058,022 A | * | 5/2000 | Gianni et al. | 333/12 X |
| 6,097,613 A | * | 8/2000 | Batten, Jr. et al. | 361/818 X |

FOREIGN PATENT DOCUMENTS

JP 4-51584 * 2/1992 ................. 361/818

* cited by examiner

Primary Examiner—Justin P. Bettendorf

(57) ABSTRACT

An apparatus and a method of electrically filtering unwanted noise signals between a computer sub-system and a power sub-system is disclosed. The computer sub-system and the power sub-system are housed within an electrically conducting housing which includes a partition between the computer sub-system and the power sub-system. The apparatus includes a bus bar connected between the power sub-system and the computer sub-system for providing direct current energy between the power sub-system and the computer sub-system. A dielectric material encompasses the bus bar. An electrically conducting material encompasses the dielectric material and is connected to the electrically conducting housing. A virtual capacitor is thereby formed between the bus bar and the housing, providing a path of least resistance for the unwanted noise signals.

27 Claims, 5 Drawing Sheets

ELECTROMAGNETIC INTERFERENCE BLOCKING POWER BUS BAR

THE FIELD OF THE INVENTION

The present invention relates generally to the suppression of electromagnetic interference within an electrical system, and more particularly to the suppression of high frequency electromagnetic noise signals transmitted between a sub-system and a power sub-system within an overall system, such as a computer system.

BACKGROUND OF THE INVENTION

The present invention applies to any electrical or electronic system such as computer system. To those skilled in the art of computer hardware technology, it is understood that computer systems include a power source sub-system and a computer sub-system. The computer sub-system includes all hardware components other than those included in the power source sub-system. The two sub-systems are typically physically separated within a housing by a partition. A bus bar, known to those in this field, forms a conduit for DC power from the power source sub-system to the computer sub-system. The bus bar usually carries a large amount of current to the computer sub-system in order for the computer sub-system to properly operate.

A specific problem with prior art computer systems is that electromagnetic interference (EMI), which can further be described as a high frequency alternating current noise signal originating in the computer sub-system, is transmitted via the bus bar from the computer sub-system to the power source sub-system. Thus, it has become a priority to electrically isolate the power source sub-system from the computer sub-system, thereby preventing unwanted EMI signals from reaching the power source sub-system. In this application, electrical isolation as used here is defined as radio frequency (RF) isolation only. It is neither practical nor desirable to include direct current (DC) isolation in this definition. One way of electrically isolating the power source sub-system from the computer sub-system is by providing an RF electrical path from the computer sub-system to another location (other than the power source sub-system) having less RF impedance than either the power source sub-system or the computer sub-system. As is well known in the art, electrical current will follow a path of least resistance. A related problem is found in commercial server applications configured with multiple bus bars, with some of the bus bars having high current and low voltage drop requirements. In this type of commercial server configuration, each bus bar provides a conduit for unwanted EMI signals.

Conventional solutions for the above-discussed EMI related problems typically include some type of a feed-through filter. One specific solution that has been developed is the utilization of a lead-type capacitor, which is a capacitor having a plurality of leads for connection to circuitry external to the capacitor. This solution connects the lead-type capacitor between the bus bar and the housing enclosing the computer sub-system and the power source sub-system. Thus, unwanted EMI signals are bypassed through the lead-type capacitor into the housing, rather than transmitted to the power source. However, the disadvantage of using a lead-type capacitor in this configuration is that lead-type capacitors are not adequate RF solutions because of the parasitic inductance that is unavoidably associated with these type of components. Specifically, lead-type capacitors will not work at frequencies greater than 100 megahertz. Therefore, lead-type capacitors will not properly suppress RF EMI signals greater than 100 megahertz.

A second specific solution to the above-discussed problem is the use of a feed-through capacitor. A feed-through capacitor, while physically capable of suppressing EMI signals, is not a viable solution because it is an expensive component and is expensive to incorporate into a computer system. Feed-through capacitors have the appearance in general of a stud or a bolt such that it is necessary to bore holes in the computer housing and provide attachment on both sides of the feed-through capacitor. These interface connections on either side of the feed-through capacitor become problematic because the connections produce a large DC impedance. It becomes a logistical problem to insure that a DC connection is provided through the feed-through capacitor. Additionally, feed-through capacitors are formed from extremely high dielectric ceramics, which are very brittle. The ceramic can fracture and cause a short inside of the capacitor. In extreme examples, the capacitor can heat up and start on fire.

Thus, there is a need for an apparatus and a method for preventing EMI noise signals from escaping a computer sub-system and entering a power source sub-system via a traditional bus bar. It is desirous to have an apparatus and a method which will be reliable, inexpensive in its components, and inexpensive to implement.

SUMMARY OF THE INVENTION

The apparatus of the present invention includes a bus bar connected between the power sub-system and the computer sub-system for providing direct current signals between the power sub-system and the computer sub-system. A dielectric material encompasses the bus bar, while an electrically conducting material encompasses the dielectric material and is connected to the electrically conducting housing. Any electromagnetic interference from the computer sub-system will be transmitted to the electrically conducting housing and returned to the portion of the housing surrounding the computer sub-system via a virtual capacitor formed by the dielectric material positioned between the bus bar and the electrically conducting material.

In one embodiment of the present invention, the bus bar is formed from a copper alloy material in a rectangular shape, the dielectric material is formed from a MYLAR® brand polyester film composition, and the electrically conducting material is a copper foil material. Additionally, due to the materials used and the configuration of the capacitor, the capacitor has a capacitance of greater than 1500 pico-farrods and operate at a frequency of greater than 200 megahertz.

In another embodiment of the present invention, multiple bus bars are utilized between the power sub-system and the computer sub-system. Each bus bar is separated from each adjacent bus bar by either a single dielectric layer or a combination of a single electrically conducting layer positioned between two dielectric layers. Therefore, the present invention encompasses suppressing EMI signals from one or more bus bars.

One aspect of the present invention is the formation of an aperture within a partition of the housing. The partition creates two sub-housings, one sub-housing for the power sub-system and one sub-housing for the computer sub-system. The capacitor formed from the dielectric material located between the bus bar and the electrically conducting material is positioned such that it protrudes through the aperture in the partition. A conductive gasket electrically connects the electrically conducting material to the housing by sealing the aperture around the electrically conducting material.

In yet another embodiment of the present invention, a method of filtering the electromagnetic interference signal between a computer sub-system and a power sub-system is disclosed. The method includes encompassing the bus bar with a dielectric material. The dielectric material is then encompassed within an electrically conducting material. The electrically conducting material is in electrical connection with an electrically conducting housing. A virtual capacitor is thereby formed between the bus bar and the housing, providing a path of least resistance for the unwanted noise signals.

The present invention provides an apparatus and a method which provides a solution for the problem of electromagnetic interference signals, which are a high frequency alternating current noise signals, escaping a computer sub-system enclosure and entering a power source sub-system enclosure. The apparatus electrically suppresses or filters unwanted EMI signals between a computer sub-system and a power sub-system, thereby preventing unwanted noise signals to be transmitted between the computer sub-system and the power sub-system. An electrically conducting housing encompasses both the computer sub-system and the power sub-system, and includes a partition between the computer sub-system and the power sub-system.

DESCRIPTION OF THE PREFERRED EMBODIMENTS

In the following detailed description of the preferred embodiments, reference is made to the accompanying drawings which form a part hereof, and which illustrate specific embodiments in which the present invention may be practiced. Throughout the drawings, identical numerals refer to similar or identical parts. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention applies to any electrical or electronic system. However, for clarity sake, the present application will specifically address a computer system. The present invention addresses the issue of preventing electromagnetic interference (EMI) from escaping a computer system enclosure and interfering with a power source. A common method in aiding in the suppression of EMI signals, also known as radio frequency (RF) alternating current noise signals, includes the segregation of a power source sub-system from a computer sub-system via a physical partition. This partition reduces the size of the critical containment vessel of the computer sub-system to the portion that surrounds the system board and the inputs/outputs. The power source enclosure can be designed with much less electromagnetic containment requirements. Power segregation is especially useful when multiple power sources must be considered as in telecom applications where a 48-volt direct current line must be available along with a conventional power line. Furthermore, the necessity to restrict cooling vent openings in the power sub-system is eliminated.

Figure 1:
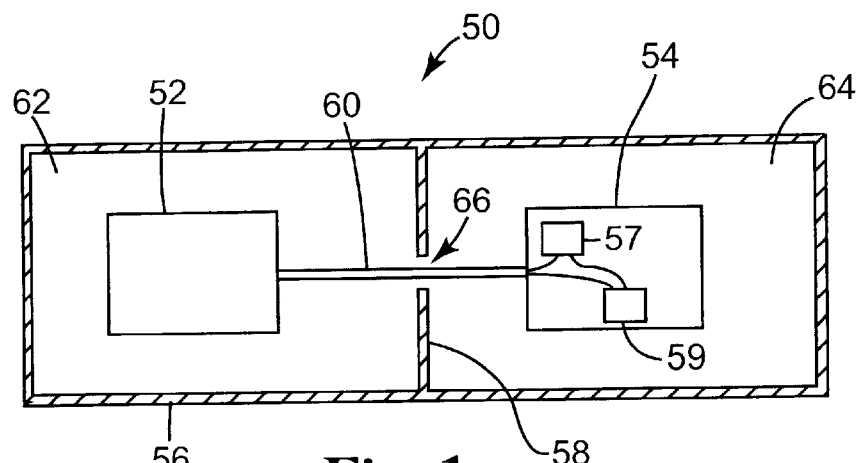
FIGS. 1, 2A, and 2B are sectional views of a prior art computer system.

The process of electrically isolating the power source sub-system from the computer sub-system, and thereby preventing the transmittal of EMI signals, is a critical issue. FIG. 1 illustrates a cross section view of computer system 50. Computer system 50 includes power source sub-system 52 and computer sub-system 54. Power source sub-system 52 is housed within power source domain 62 and computer sub-system 54 is housed within computer domain 64. Both sub-systems are enclosed within housing 56 and are physically separated from each other by partition 58. Housing 56 and partition 58 are formed from an electrically conducting material.

Present computer designs separate power source domain 62 from computer domain 64 with partition 58. As shown in FIG. 1, bus bar 60 forms a conduit for DC power between power source sub-system 52 and computer sub-system 54. Typically, bus bar 60 provides relatively large currents at low voltages for powering various electrical components, such as electronic components 57 and 59, within computer sub-system 54. FIG. 1 illustrates a prior art low performance system where no provision for bypassing EMI noise signal is used.

One problem with the present design of computer hardware systems is preventing unwanted electromagnetic interference (EMI) signals from escaping computer sub-system 54 housed within computer domain 64. Transmission of EMI signals, which are RF alternating current noise signals, to power source sub-system 52 housed within power source domain 62 can limit the overall performance of computer system 50. Thus, it is desirous to confine EMI signals within computer domain 54 and block EMI signals from entering power source domain 62.

It is understood by those in the art that preventing EMI signal transmission from computer sub-system 54 through partition 58 into power source domain 62 is necessary in order for computer system 50 to comply with regulatory emissions requirements. Therefore, a filtering configuration is necessary to filter the unwanted EMI signals, thereby preventing the unwanted signal from entering power source sub-system 52. In prior art systems where no filtering is done between internal domains, alternate approaches are used such as line cord filtering or other techniques.

Conventional solutions have also utilized the placement of an actual capacitor between bus bar 60 and housing 56 or partition 58. Conventional designs, such as those discussed in the Background section the present application, have utilized either a feed-through capacitor or a lead-type capacitor.

Figure 2A:
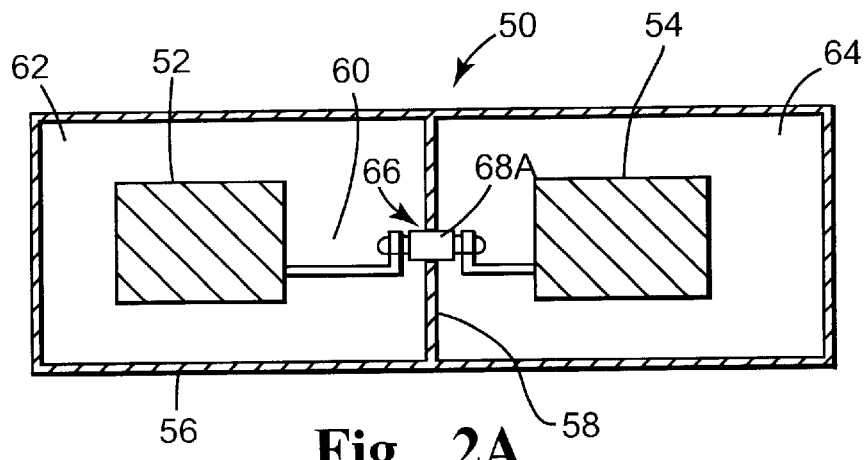
Figure 2B:
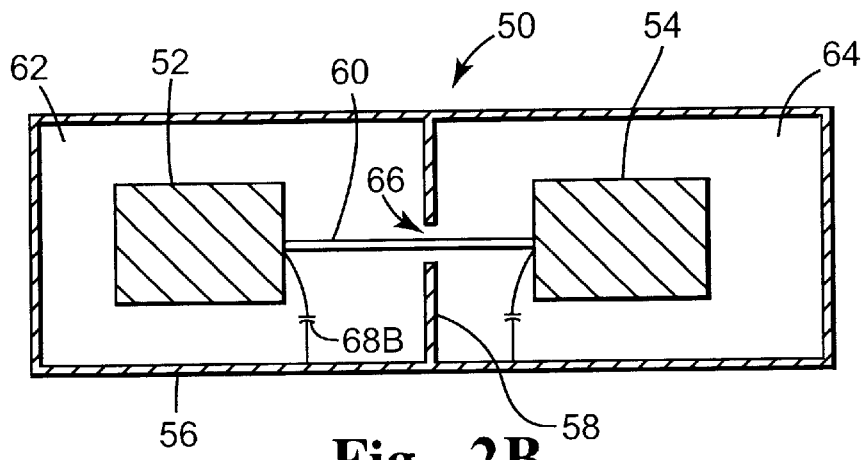

FIGS. 2A and 2B show sectional views incorporating two prior art solutions. As shown in FIGS. 2A and 2B, power source sub-system 52 is housed within power source domain 62, while computer sub-system 54 is housed within computer domain 64. Bus bar 60 electrically interconnects power source sub-system 52 and computer sub-system 54. Partition 58 has aperture 66 through which bus bar 60 is positioned. Capacitor 68A, shown in FIG. 2A, is a feed-through capacitor and is connected to partition 58 and bus bar 60. Capacitor 68B, shown in FIG. 2B, is a lead-type capacitor and is connected between bus bar 60 and housing 56. As shown in FIG. 2B, when lead-type capacitors are used, they usually reside on the system printed circuit board or in the power system assembly.

Lead-type capacitors and feed-through capacitors each have several disadvantages. Lead-type capacitors are not adequate solutions due to their inadequacy at high frequencies. The parasitic inductance associated with the leads of a lead-type capacitor does not permit this type of capacitor to properly operate at high frequencies. Therefore, lead-type capacitors will not properly suppress high frequency EMI signals.

While feed-through capacitors will properly operate at the necessary frequencies, these individual components are both expensive and expensive to mount within computer 50. A feed-through capacitor has the general appearance of a stud or a bolt. A hole must be boared through partition 58 and bus bar 60 attached to the terminals of the feed-through capacitor. Also, the interface connections on either side of the feed-through capacitor becomes problematic because these connections represent high DC impedances. Therefore, there becomes a logistical problem to getting a DC connection to go through a feed-through capacitor having the necessary requirements. Also, in order to operate in the high current range necessary for the types of computer systems that are currently being manufactured, the actual size of a feed-through capacitor becomes quite large. Additionally, feed-through capacitors are formed from extremely high dielectric ceramics, which are very brittle. The ceramic can fracture and cause a short inside of the capacitor. In extreme examples, the capacitor can heat up and start on fire.

The present invention provides a filtered bus bar which transmits necessary current between power source sub-system 52 and computer sub-system 54, while preventing unwanted EMI signals from being transmitted to power source sub-system 52 from computer sub-system 54. The present invention does not utilize an actual capacitive device which must be mounted to both partition 58 and bus bar 60, but rather a virtual capacitor is formed between partition 58 and bus bar 60.

Figure 3:
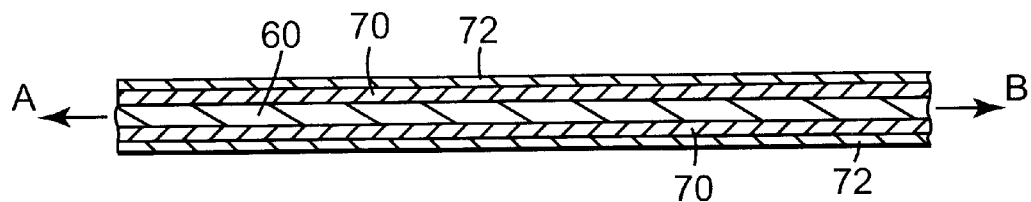
FIG. 3 is a sectional view of a portion of a bus bar incorporating the present invention.

FIG. 3 is a sectional view showing the basic concept of the present invention. FIG. 3 is a sectional view of a portion of bus bar 60 for connecting to power source sub-system 52 in the direction of arrow A and connecting to computer sub-system 54 in the direction of arrow B. It is understood that bus bar 60 is formed from an electrically conducting material, thereby permitting power signals to be transmitted from power source sub-system 52 to computer sub-system 54. As shown in FIG. 3, bus bar 60 has dielectric material 70 positioned above and below bus bar 60. In reality, dielectric material 70 would surround and encompass bus bar 60. Also shown in FIG. 3 is electrically conducting material 72 positioned above and below dielectric material 70. It is also understood that electrically conducting material 72 would surround and encompass dielectric material 70. Therefore, a virtual capacitor is formed having electrically conducting layers 60 and 72 separated by dielectric material 70.

In one embodiment, bus bar 60 of the present invention is formed having a rectangular structure, a width in the range of approximately 0.50 to 1.00 inches, and a thickness in the range of approximately 0.025 to 0.150 inches. In one embodiment, bus bar 60 is formed from a copper alloy or copper material. It is understood, however, that any material having the ability to transmit electrical signals may be utilized for bus bar 60. Bus bar 60 is immediately surrounded by a dielectric or insulating material having a relatively thin cross-section, such as in the range of approximately 0.00050 to 0.0010 inches. In one embodiment, dielectric 70 is formed from MYLAR® brand polyester film having dielectric or insulating properties. In another embodiment, dielectric 70 is formed from KAPTON® brand polymide material or tape having dielectric or insulating properties. It is understood, however, that any material having dielectric qualities may be utilized for dielectric 70.

Completely surrounding and encompassing dielectric 70 is electrically conducting material 72. In one embodiment, electrically conducting material 72 is formed from a copper foil material. It is understood, however, that any material having electrically conducting qualities may be utilized for material 70. Bus bar 60, dielectric material 70, and electrically conducting material 72 form a virtual and distributed capacitor over the length of bus bar 60 which is encompassed by dielectric material 70 and electrically conducting material 72. The length of bus bar 60 which is encompassed within dielectric material 70 and electrically conducting material 72 may vary and can be predetermined in order to achieve a desired capacitance, depending upon the EMI signals produced within computer sub-system 54. Alternatively stated, with the knowledge of the specific components used within computer sub-system 54, the amount of EMI noise can be calculated. Thus, the capacitance necessary to filter the EMI noise can be calculated and a virtual capacitance meeting this criteria can be designed. As a default, bus bar 60 can be encompassed within dielectric material 70 and electrically conducting material 172 the entire length between power source sub-system 52 and computer sub-system 54.

Figure 4:
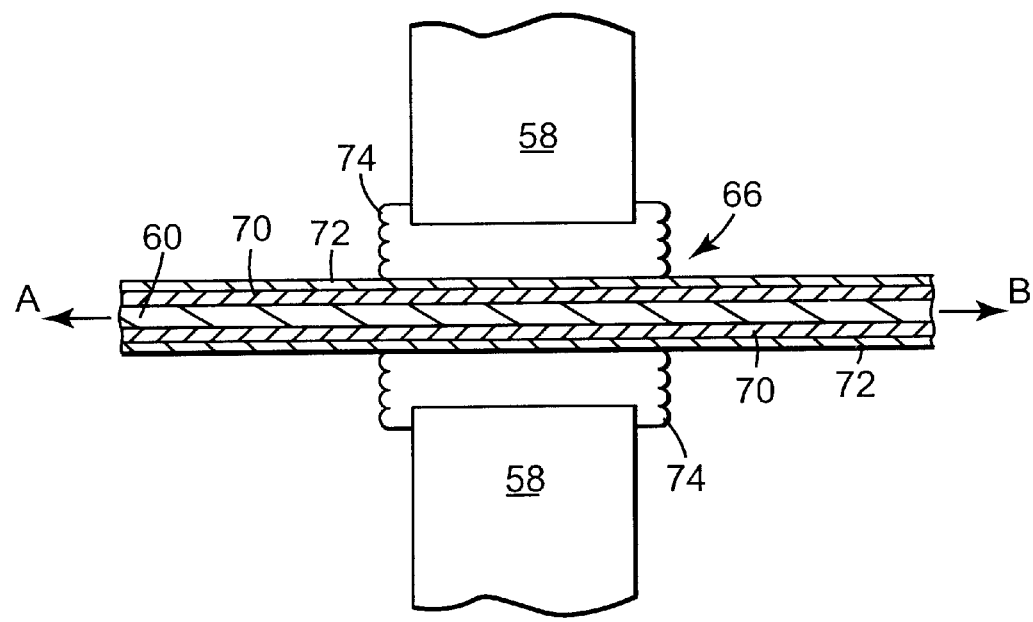
FIG. 4 is a sectional view of a bus bar shown protruding through an aperture within a housing partition incorporating the present invention.

FIG. 4 is a sectional view showing the connection between partition 58 and bus bar 60. Bus bar 60 is interconnected between power source sub-system 52 and computer sub-system 54 in the directions shown by arrows A and B, respectively. Bus bar 60, along with dielectric material 70 and electrically conducting material 72 are positioned within aperture 66 of partition 58. Conductive gasket 74 physically and electrically seals aperture 66 such that bus bar 60 is in electrical connection with partition 58. Conductive gasket 74 is formed from any type of electrically conducting material and is configured such that it is in direct contact with partition 58 at all points around aperture 66 and at all points around electrically conducting material 72. Bus bar 60 physically penetrates aperture 66, but there is no visible opening that is not filled by conductive gasket 74. Thus, bus bar 60 is connected to partition 58 in a low impedance configuration such that it provides a high frequency solution to the problem of EMI signals.

While FIG. 4 shows bus bar 60 in electrical connection with partition 58, it is understood by those in the art that bus bar 60 can be connected to housing 56 or partition 58 at various locations. The greater the number of electrical connections, the lower each individual impedance path. In other words, by providing various alternate paths between bus bar 60 and housing 56, the impedance within a single path is smaller because multiple parallel paths are available. The present invention, as described with reference to FIGS. 3 and 4, disclose a virtual capacitor which has a capacitance in each alternate path of greater than approximately 1500 picofarrods and operates at a frequency of greater than 200 megahertz and preferably up to 3.0 gigahertz.

The embodiment of the present invention shown in FIGS. 3 and 4 disclose a high frequency virtual capacitor where one plate, which is electrically conducting material 72, is intimately connected to a return path which is partition 58 and housing 56, while the second plate of the virtual capacitor is bus bar 60 which normally transmits unwanted EMI noise signals from the computer sub-system 54 to power system 52. However, the EMI signals will follow the path of least impedance. Therefore, since the impedance through the virtual capacitor to housing 56 has less impedance than that of bus bar 60 and the power source sub-system 52, the high frequency EMI signals will follow the path through the virtual capacitor to housing 56. The EMI signals will then harmlessly return through housing 56 back to its source and never reach power source sub-system 52.

Figure 5:
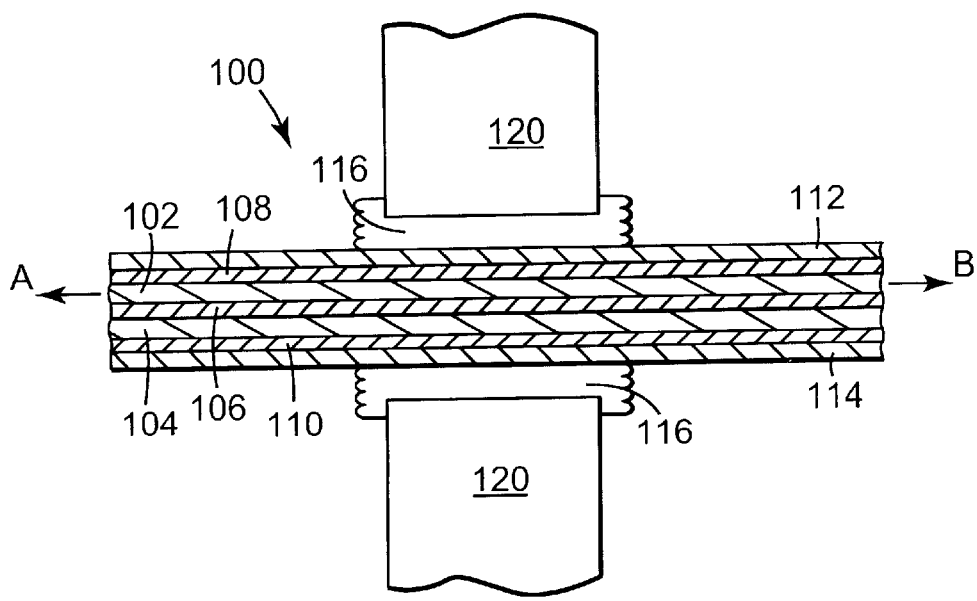
FIG. 5 is a sectional view of an alternative embodiment of the present invention showing a plurality of bus bars.

Computer system 50 of FIGS. 3 and 4 shows a singular bus bar interconnected between power source sub-system 52 and computer sub-system 54. However, multiple bus bars are sometimes utilized in present day computer systems. Therefore, FIG. 5 shows a cross-sectional view of a portion of computer system 100 in which multiple bus bars are interconnected between a power source sub-system and a computer sub-system. Computer system 100, as shown in FIG. 5, includes bus bars 102 and 104, dielectric materials 106, 108, and 110, electrically conducting materials 112 and 114, conductive gasket 116, and partition 120. Bus bars 102 and 104 would be connected to a power source sub-system and a computer sub-system similar to those shown in FIGS. 3 and 4 as directed by arrows A and B, respectively.

While only two bus bars, bus bars 102 and 104, are shown in FIG. 5, it is understood by those in the art that multiple bus bars could be stacked upon each other having a dielectric material, such as dielectric material 106 positioned between each pair of bus bars. In this embodiment, one of the filtered bus bars could carry a DC potential, which may be a variety of voltages, for example 5.0 volts or 3.3 volts. A second filter bus bar could carry another DC voltage, while a third filtered bus bar could carry a ground return. Regardless of the number of stacked bus bars, the concept of a virtual capacitor formed along the length of the bus bars is still desirable and applicable. Once again, one or more virtual and distributed capacitors are formed between each bus bar and partition 120, thereby providing a path of least resistance for high frequency EMI signals.

Figure 6:
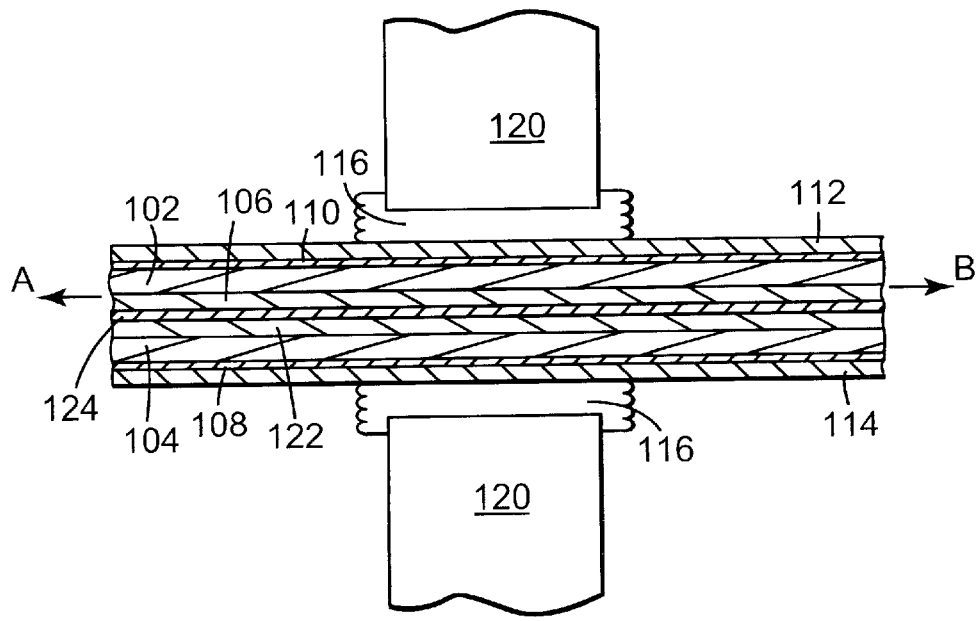
FIG. 6 is a sectional view of a second alternative embodiment of the present invention showing a plurality of bus bars.

FIG. 6 is a sectional view showing a second alternate embodiment of the present invention. The sectional view shown in FIG. 6 is similar to the sectional view shown in FIG. 5, except that instead of having a single dielectric material, such as dielectric material 106 positioned between each pairs of bus bars, two dielectric materials, shown in FIG. 6 as dielectric materials 106 and 122, separated by an electrically conducting material, such as electrically conducting material 124, are positioned between each pair of bus bars. Once again, with the concept shown in FIG. 6, the entire structure operates as a distributed capacitor which will filter unwanted EMI noise signals through a housing, rather than transmitting unwanted EMI noise signals to the power source sub-system. While only two bus bars are shown in FIG. 6, it is understood by those in the art that multiple bus bars could be stacked upon each other having two dielectric materials separated by an electrically conducting material positioned between each bus bar.

Figure 7:
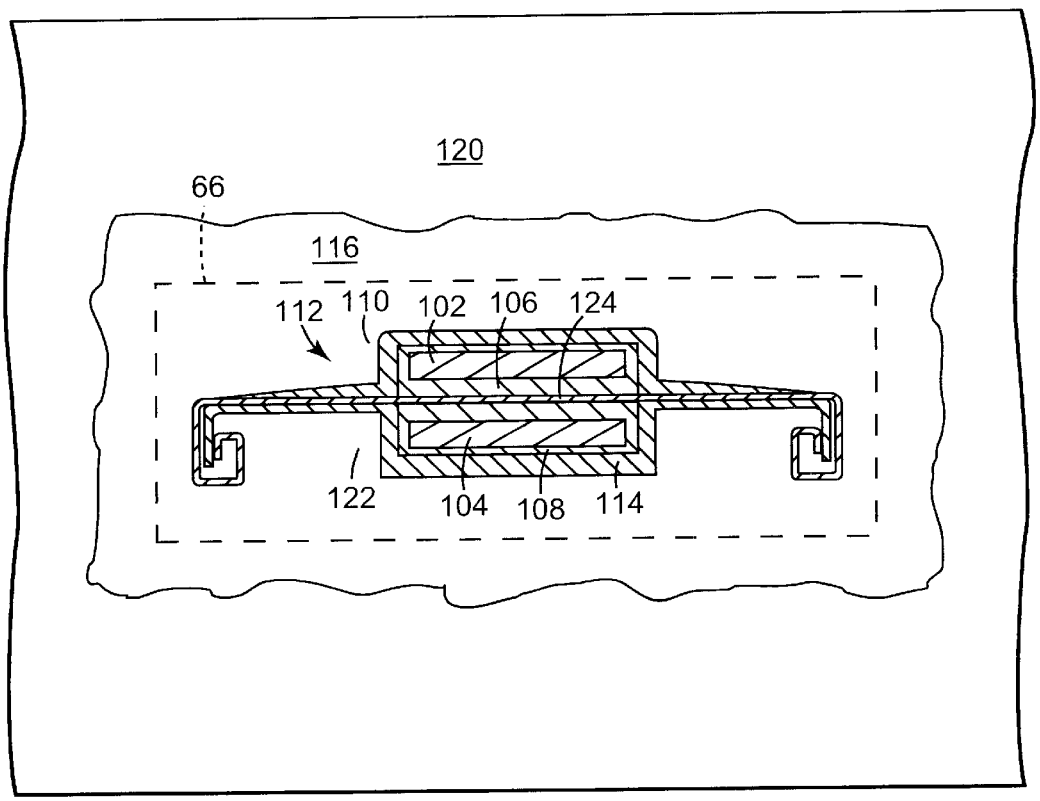
FIG. 7 is a sectional end view of the second alternate embodiment incorporating the present invention.

FIG. 7 is a sectional end view of the second alternate embodiment shown in FIG. 6. The end view of FIG. 7 includes bus bars 102 and 104, dielectric materials 106, 108, 110, and 122, electrically conducting materials 112, 114 and 124, conductive gasket 116, and partition 120. As shown in FIG. 7, dielectric materials 106 and 110 encompass bus bar 102, while dielectric materials 108 and 122 encompass bus bar 104. Also, electrically conducting materials 112, 114 and 124 extend horizontally further than any other layers and encompass all other layers. These three electrically conducting materials are then rolled in a serpentine or coil configuration. Also shown in FIG. 7, conductive gasket 116 completely closes a previously formed aperture in partition 120 through which the multi-layered design penetrates.

Figure 8:
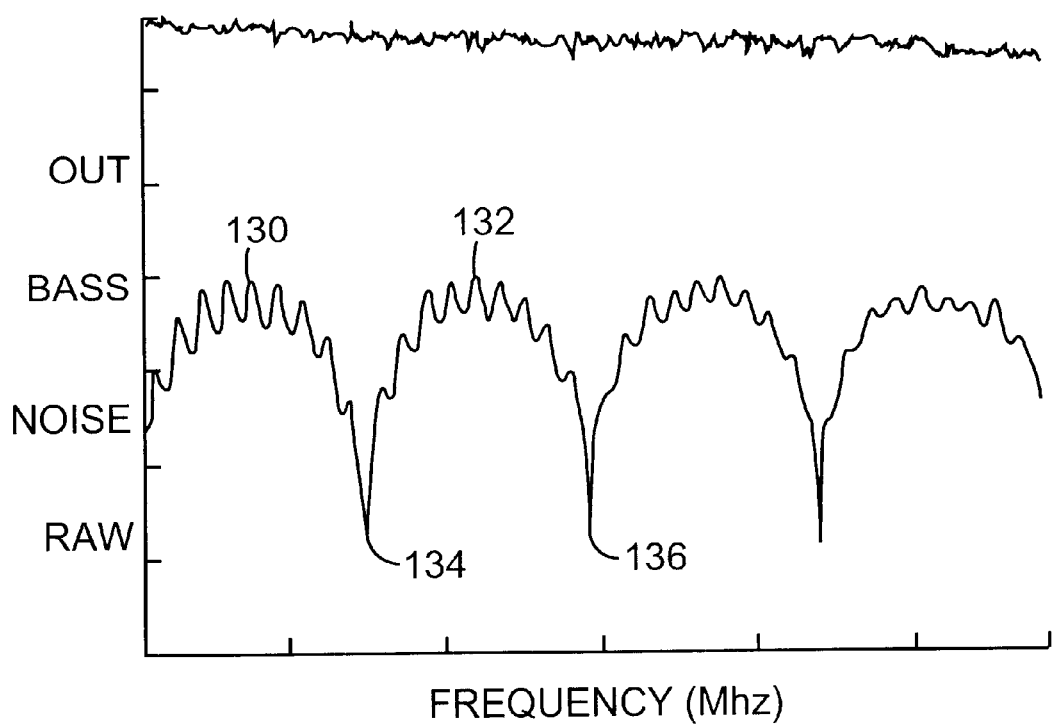
FIG. 8 is a graphical representation of the attenuation of electromagnetic interference through use of the present invention.

FIG. 8 is a graphical representation showing the attenuation of unwanted EMI noise signals versus a spectrum of operating frequencies. Due to the configuration of the present invention, the attenuation of noise signals is great at certain frequencies, such as indicated at 130 and 132. FIG. 8 also shows dips in attenuation as indicated at 134 and 136. However, as can be seen from the graphical representation of FIG. 8, the dips in attenuation are of incredibly short durations as compared to the portions of the graph having good attenuation. Thus, the graphical representation of FIG. 8 illustrates that the design shown in FIGS. 3 through 7 provides acceptable attenuation for the desired application.

The present invention provides a solution to the problem of EMI signals escaping a computer sub-system and entering a power source sub-system. A virtual capacitor is created between a bus bar and a housing of the computer system. The virtual capacitor does not suffer from the shortcomings of prior art designs. Specifically, the present invention is capable of operating at high frequencies and is more reliable and cost efficient than prior art designs.

Although specific embodiments have been illustrated and described herein for purposes of description of the preferred embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in electro-mechanical, electrical, and computer arts will readily appreciate that the present invention may be implemented in a wide variety of embodiments. This application is intended to cover any adaptations or variations of the preferred embodiments discussed herein. Therefore, it is manifestly intended that this invention be limited only by the appended claims and the equivalents thereof.

What is claimed is:

1. A system comprising:
    a power sub-system;
    an electrical component sub-system;
    a bus bar connected between the power sub-system and the electrical component sub-system, the bus bar providing power between the power sub-system and the electrical component sub-system;
    a dielectric material encompassing the bus bar for substantially the entire length of the bus bar between the power sub-system and the electrical component sub-system;
    an electrically conducting material encompassing the dielectric material for substantially the entire length of the bus bar between the power sub-system and the electrical component sub-system;
    an electrically conducting housing enclosing the power sub-system and the electrical component sub-system and electrically connected to the electrically conducting material; and an electrically conducting partition providing electromagnetic interference (EMI) electrical isolation between the power sub-system and the electrical component sub-system and electrically connected to the electrically conducting housing and the electrically conducting material.

2. The system of claim 1, wherein the system is a computer system.

3. An apparatus for providing direct current energy between a power sub-system and a computer sub-system and for electrically filtering alternating current between the power sub-system and the computer sub-system, the power sub-system and the computer sub-system housed within an electrically conducting housing which includes an electrically conducting partition providing electromagnetic interference (EMI) electrical isolation between the power sub-system and the computer sub-system, the apparatus comprising:

a bus bar connected between the power sub-system and the computer sub-system, the bus bar providing direct current power between the power sub-system and the computer sub-system;

a dielectric material encompassing the bus bar for substantially the entire length of the bus bar between the power sub-system and the electrical component sub-system; and an electrically conducting material encompassing the dielectric material for substantially the entire length of the bus bar between the power sub-system and the electrical component sub-system and connected to the electrically conducting housing and partition.

4. The apparatus of claim 3, wherein the bus bar connected between the power sub-system and the computer sub-system further comprises a copper alloy bus bar having a rectangular structure.

5. The apparatus of claim 3, wherein the dielectric material encompassing the bus bar further comprises a polyester film tape dielectric encompassing the bus bar.

6. The apparatus of claim 3, wherein the electrically conducting material encompassing the dielectric material further comprises a copper foil material encompassing the dielectric material and connected to the electrically connecting housing.

7. The apparatus of claim 3, wherein the electrically conducting material encompassing the dielectric material protrudes through an aperture in the partition and is electrically connected to the partition via a conductive gasket which completely fills the aperture in the partition surrounding the electrically conducting material.

8. The apparatus of claim 3, wherein a capacitor formed by the dielectric material positioned between the bus bar and the electrically conducting material has a capacitance of greater than 1500 picofarrods.

9. The apparatus of claim 8, wherein the capacitor operates at a frequency greater than 200 megahertz.

10. A system for filtering unwanted noise between a computer sub-system and a power sub-system, the system comprising:

a bus bar connected between the power sub-system and the computer sub-system, for providing direct current power between the power sub-system and the computer sub-system;

a dielectric material encompassing the bus bar for substantially the entire length of the bus bar between the power sub-system and the electrical component sub-system;

an electrically conducting material encompassing the dielectric material for substantially the entire length of the bus bar between the power sub-system and the electrical component sub-system;

an electrically conducting housing which encompasses the computer sub-system and the power sub-system and which includes an electrically conducting partition providing electromagnetic interference (EMI) electrical isolation between the power sub-system and the computer sub-system, wherein the bus bar, the dielectric, and the electrically conducting material penetrate the partition via an aperture in the partition; and an electrically conductive gasket positioned between the electrically conductive material and the electrically conducting partition, thereby electrically and mechanically sealing the aperture in the partition and electrically connecting the electrically conductive material to the electrically conducting partition.

11. The apparatus of claim 10, wherein the bus bar connected between the power sub-system and the computer sub-system further comprises a copper alloy bus bar having a rectangular structure.

12. The apparatus of claim 10, wherein the dielectric material encompassing the bus bar further comprises a polyester film tape dielectric encompassing the bus bar.

13. The apparatus of claim 10, wherein the electrically conducting material encompassing the dielectric material further comprises a copper foil material encompassing the dielectric material.

14. The apparatus of claim 10, wherein a capacitor formed by the dielectric material positioned between the bus bar and the electrically conducting material has a capacitance of greater than 1500 picofarrods.

15. The apparatus of claim 14, wherein the capacitor operates at a frequency greater than 200 megahertz.

16. A system for filtering unwanted noise between a computer sub-system and a power sub-system, the system comprising:

an electrically conducting housing enclosing the computer sub-system and the power sub-system;

an electrically conducting partition providing electromagnetic interference (EMI) electrical isolation between the power sub-system and the computer sub-system and electrically connected to the electrically conducting housing;

an electrically conducting material connected between the computer sub-system and the power sub-system and in electrical connection with the electrically conducting housing and the electrically conducting partition;

an outer dielectric material encompassed by the electrically conducting material for substantially the entire length of the outer dielectric material between the computer sub-system and the power sub-system;

a plurality of bus bars encompassed by the outer dielectric material for substantially the entire length of the bus bars between the computer sub-system and the power sub-system and connecting the power sub-system and the computer sub-system for providing direct current power between the power sub-system and the computer sub-system; and at least one inner dielectric material positioned between each pair of bus bars for substantially the entire length of the bus bars between the computer sub-system and the power sub-system.

17. The system of claim 16, wherein each of the plurality of bus bars is formed from a copper material formed in a rectangular structure.

18. The system of claim 16, wherein the inner dielectric materials and the outer dielectric materials are formed from a polyester film.

19. The system of claim 16, wherein the electrically conducting material is formed from a copper foil material.

20. A method of filtering unwanted noise on a bus bar between a computer sub-system and a power sub-system, the power sub-system and the computer sub-system housed within an electrically conducting housing which includes an electrically conducting partition providing electromagnetic interference (EMI) electrical isolation between the power sub-system and the computer sub-systems the bus bar providing power from the power sub-system to the computer sub-system, the method comprising:

encompassing the bus bar with a dielectric material for substantially the entire length of the bus bar between the power sub-system and the electrical component sub-system;

encompassing the dielectric material with an electrically conducting material for substantially the entire length of the bus bar between the power sub-system and the electrical component sub-system; and electrically connecting the electrically conducting material to the electrically conducting housing and the electrically conducting partition.

21. The method of claim 20, wherein the step of encompassing the bus bar with the dielectric material further comprises:

encompassing a copper material having a rectangular structure with a dielectric material.

22. The method of claim 20, wherein the step of encompassing the bus bar with the dielectric material further comprises:

encompassing the bus bar with a polyester film.

23. The method of claim 20, wherein the step of encompassing the dielectric material with an electrically conducting material further comprises:

encompassing the dielectric material with a copper foil material.

24. The method of claim 23 and further comprising:

positioning the electrically conducting material through an aperture in a partition of a housing, the partition physically isolating the computer sub-system from the power sub-system.

25. The method of claim 24 and further comprising:

forming a conductive gasket within the aperture of the partition, thereby electrically connecting the electrically conducting material with the housing.

26. The method of claim 20 and further comprising:

forming a capacitor between the bus bar and the housing having a capacitance of greater than 1500 picofarrods.

27. The method of claim 20 and further comprising:

forming a capacitor between the bus bar and the housing operating at a frequency of greater than 200 megahertz.

* * * * *

UNITED STATES PATENT AND TRADEMARK OFFICE
CERTIFICATE OF CORRECTION

PATENT NO. : 6,404,297 B2
DATED : June 11, 2002
INVENTOR(S) : Andrew Michael Cherniski et al.

It is certified that error appears in the above-identified patent and that said Letters Patent is hereby corrected as shown below:

Column 11,
Line 12, delete "computer sub-systems" and insert therefor -- computer sub-system, --

Signed and Sealed this

Twenty-first Day of June, 2005

JON W. DUDAS
*Director of the United States Patent and Trademark Office*